United States Patent
Okabe et al.

(10) Patent No.: US 6,858,116 B2
(45) Date of Patent: Feb. 22, 2005

(54) SPUTTERING TARGET PRODUCING FEW PARTICLES, BACKING PLATE OR SPUTTERING APPARATUS AND SPUTTERING METHOD PRODUCING FEW PARTICLES

(75) Inventors: Takeo Okabe, Ibaraki (JP); Yasuhiro Yamakoshi, Ibaraki (JP); Hirohito Miyashita, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 151 days.

(21) Appl. No.: 10/297,232

(22) PCT Filed: May 23, 2001

(86) PCT No.: PCT/JP01/04297

§ 371 (c)(1),
(2), (4) Date: Dec. 2, 2002

(87) PCT Pub. No.: WO02/40733

PCT Pub. Date: May 23, 2002

(65) Prior Publication Data

US 2003/0116425 A1 Jun. 26, 2003

(30) Foreign Application Priority Data

Nov. 17, 2000 (JP) ........................................ 2000-350475

(51) Int. Cl.[7] .............................................. C23C 14/34
(52) U.S. Cl. ........................... 204/192.12; 204/298.12; 204/298.13; 427/446; 427/455; 427/456
(58) Field of Search ....................... 204/192.12, 298.12, 204/298.13; 427/446, 455, 456

(56) References Cited

U.S. PATENT DOCUMENTS 5,244,556 A * 9/1993 Inoue .................... 204/192.12
5,965,278 A   10/1999 Finley et al.
2003/0155235 A1  8/2003 Miyashita et al. ..... 204/298.12

FOREIGN PATENT DOCUMENTS

| JP | 05-214505 |   | 8/1993 |
| JP | 09-272965 | * | 10/1997 |
| JP | 11-236663 |   | 8/1999 |

OTHER PUBLICATIONS

Machine translation of Michio et al. (JP 09–272965).*
Patent Abstract of Japan One page English Abstract for JP–11–236663 Aug. 1999.
Patent Abstract of Japan one page English abstractfor JP 09–272965 Oct. 1997.
Patent Abstract of Japan one page English abstract JP 05–214505 Aug. 1993.

* cited by examiner

Primary Examiner—Rodney G. McDonald
(74) Attorney, Agent, or Firm—Howson and Howson

(57) ABSTRACT

A sputtering target producing few particles, a backing plate or a sputtering apparatus, and a sputtering method producing few particles. An arc-spraying coating film and a plasma-spraying coating film over the former are formed on the sputtering target, a backing plate, or another surface in the sputtering apparatus, where an unwanted film might be formed. Thus a deposit is prevent from separating/flying from the target, backing plate, or another surface where an unwanted film might be formed in the sputtering apparatus.

19 Claims, No Drawings

SPUTTERING TARGET PRODUCING FEW PARTICLES, BACKING PLATE OR SPUTTERING APPARATUS AND SPUTTERING METHOD PRODUCING FEW PARTICLES

FIELD OF THE INVENTION

The present invention relates to a sputtering target producing few particles during deposition, a backing plate or sputtering apparatus and a sputtering method producing few particles.

BACKGROUND OF THE INVENTION

In recent years, the sputtering method capable of easily controlling the film thickness and components is being widely used as one of the deposition methods of materials for electronic and electric components.

This sputtering method makes the targets formed of a positive electrode and a negative electrode face each other and applies a high voltage between these substrates and the target under an inert gas atmosphere in order to generate an electric field, and employs the fundamental principle in which plasma is formed upon the atoms ionized at such time colliding with the inert gas, the positive ions within this plasma colliding with the target (negative electrode) surface and discharging the atoms structuring the target, whereby the film is formed by the discharged atoms adhering to the opposing substrate surface.

Upon forming a thin film with this sputtering method, the problem of the production of particles has been attracting attention. In terms of particles caused by the target during the sputtering method, for example, the thin film is deposited within the walls of the thin film forming device and all over the materials and the like therein, in addition to the substrate, when a target is sputtered. Faces and side faces other than the erosion portion of the target are no exceptions, and the deposits of sputtered particles have been observed.

And, flakes separating from such materials and the like within the thin film forming device directly flying on the substrate surface is considered to be one of the major causes for the production of particles.

Moreover, since the side face of the target is not generally facing the plasma directly, there are not that many problems regarding the production of particles from the side face. Thus, conventionally, there were numerous examples wherein measures are taken for the center part of the target and the non-erosion portion of the peripheral edge. Nevertheless, there is a trend toward the overall face of the sputtering face being sputtered in order to improve the target usage efficiency, and such measures may adversely increase the particles.

Recently, while the degree of integration of LSI semiconductor devices has increased (16M bit, 64M bit and even 256M bit) on the one hand, it is also becoming miniaturized with the wiring width being less than 0.25 ìm in some cases, and problems such as the disconnection and short circuit of wiring due to the foregoing particles now occur more frequently.

As described above, the production of particles is now even a larger problem pursuant to the advancement of high integration and miniaturization of electronic device circuits.

Generally, a sputtering target is connected to a backing plate having a larger measurement with such means as welding, diffusion bonding or soldering. From the perspective of the stabilization of sputtering, however, the side face of the sputtering target to be connected to the backing plate is usually formed to have an inclined face broadening toward such backing plate.

As publicly known, a backing plate plays the role of cooling the target by the back face thereof contacting a coolant, and materials such as aluminum or copper or the alloys thereof having a favorable thermal conductivity are used.

The side face of the foregoing sputtering target is not the portion which will erode (become subject to wear) from sputtering. Nonetheless, since it is close to the erosion face of the target, there is a trend toward the sputtered particles flying during the sputtering operation further adhering and depositing thereto.

In general, the erosion face of a sputtering target has a smooth surface from the turning process, and the foregoing inclined side face is similarly subject to the turning process.

Whereas, it has become known the sputtered particles (deposits) once adhered to the inclined side face are separated therefrom once again, float, and cause the production of particles.

Further, it has been observed that, rather than from the vicinity of the flat peripheral erosion face, the separation of such deposits occurs more often from a location distant therefrom.

This kind of phenomenon has not necessarily been clearly understood, nor were measures taken therefor. However, the production of particles in such locations has also become a major problem in light of the demands of the high integration and miniaturization of electronic device circuits as described above.

In order to overcome the foregoing problems, a proposal has been made of performing blast processing to the target side face and the backing plate vicinity and improving the adhesiveness thereby with the anchor effect.

Nevertheless, in such a case, problems such as the contamination of goods due to the remnants of the blast materials, separation of the adhered particles deposited on the residual blast materials, and separation of the adhered film caused by the selective and uneven growth thereof would newly arise, and the fundamental issues could not be resolved.

Further, even upon particularly performing such blast processing, particles tend to be produced due to the differences in the materials between the target side face and the backing plate and the difference in thermal expansion as a result thereof, and the evident difference between the materials. And, in such a case, since it is far from the foregoing erosion portion, there is problem in that this will go unnoticed as a cause of the production of particles.

In consideration of the above, the present inventors previously proposed a sputtering target producing few particles (Japanese Patent Application No. 2000-31477) comprising a sprayed coating having a center line average roughness of Ra 10 to 20 ìm at least on the side face of the sputtering target.

This technology itself, when compared with conventional methods, yielded an effect of by far preventing the separation of the adhered film and suppressing the production of particles. Nevertheless, electric arc spraying or plasma spraying was used for forming the sprayed coating and, regarding the former, the surface roughness tended to be large with much variation and the adhesiveness of the adhered film was uneven, whereas with the latter, the surface roughness tended to be small and the adhesiveness with the attachment would be inferior since the anchor effect is low, and satisfactory results could not always be obtained.

Moreover, this issue of the sprayed coating formed for suppressing the production of particles is not limited to the target side face described above, and similar issues are found in the other faces of the sputtering target, and in the face to which unnecessary films of equipment within the sputtering apparatus are deposited.

OBJECT OF THE INVENTION

In light of the foregoing problems, an object of the present invention is to obtain a sputtering target, backing plate or sputtering apparatus and a sputtering method capable seeking the improvement in the sprayed coating, and thereby directly preventing the separation and flying of a deposit from the target, backing plate or another surface where an unwanted film might be formed in the sputtering apparatus in a more effective manner.

SUMMARY OF THE INVENTION

In order to achieve the foregoing object, the present inventors discovered that the production of particles within the deposition could be efficiently suppressed by improving the sprayed coating process.

Based on this discovery, the present invention provides:
1. A sputtering target, backing plate or sputtering apparatus producing few particles, characterized in that an arc-spraying coating film and a plasma-spraying coating film over the former are formed on the sputtering target, backing plate or another surface in the sputtering apparatus where an unwanted film might be formed;
2. A sputtering target, backing plate or sputtering apparatus producing few particles according to paragraph 1 above, characterized in comprising a sprayed coating having a surface roughness of 10 to 20 µm Ra;
3. A sputtering target, backing plate or sputtering apparatus producing few particles according to paragraph 1 or paragraph 2 above, characterized in sequentially comprising a sprayed coating along the sputtering target side face or the backing plate face;
4. A sputtering target, backing plate or sputtering apparatus producing few particles according to each of paragraphs 1 to 3 above, characterized in comprising a sprayed coating along the backing plate direction or backing plate face from a side face position slightly distant than the sputtering face of the sputtering target;
5. A sputtering target, backing plate or sputtering apparatus producing few particles according to each of paragraphs 1 to 4 above, characterized in that aluminum or an aluminum alloy is used as the sprayed coating;
6. A sputtering method producing few particles, characterized in that an arc-spraying coating film and a plasma-spraying coating film over the former are formed on the sputtering target, backing plate or another surface in the sputtering apparatus where an unwanted film might be formed;
7. A sputtering method producing few particles according to paragraph 6 above, characterized in comprising a sprayed coating having a surface roughness of 10 to 20 µm Ra;
8. A sputtering method producing few particles according to paragraph 6 or paragraph 7 above, characterized in sequentially comprising a sprayed coating along the sputtering target side face or the backing plate face;
9. A sputtering method producing few particles according to each of paragraphs 6 to 8 above, characterized in comprising a sprayed coating along the backing plate direction or backing plate face from a side face position slightly distant than the sputtering face of the sputtering target; and
10. A sputtering method producing few particles according to each of paragraphs 6 to 9 above, characterized in that aluminum or an aluminum alloy is used as the sprayed coating.

DETAILED DESCRIPTION OF THE PREFERRED EMBODIMENTS

As a method of spraying aluminum or aluminum alloy, there is arc spraying and plasma spraying. Arc spraying and plasma spraying are the same in principle, and are methods in which arc spraying uses an arc as the heat source and plasma spraying uses a plasma jet flame to melt the spraying material, which makes the high-temperature melting particles fly and collide with the material surface, and laminates the same in order to form a coating.

Nevertheless, it has been discovered that an extremely large difference exists upon performing this arc spraying or plasma spraying on the sputtering target, backing plate or another surface in the sputtering apparatus where an unwanted film might be formed and having examined the separation of the coating.

Upon forming a sprayed coating with only arc spraying, the surface area of the melting portion of aluminum or aluminum alloy was large, separation resistance was worse than expected, and the surface condition was one which left concern. And, as a result of performing the actual sputtering, the partial separation of the deposit was observed.

Contrarily, when forming a sprayed coating with only plasma spraying, it lacked the surface roughness, the anchor effect was low, the adhesiveness with the adhered film during sputtering was reduced, and, as a result, the particle reduction effects became inferior.

Thus, upon examining the various possibilities of the spraying method, it has been discovered that by forming an arc spraying coating film and further forming a plasma spraying coating film thereon, a sprayed coating having an even and optimum surface roughness against a surface of a fixed surface area can be formed.

Generally, with plasma spraying, the melting particles have larger collision energy in comparison to arc spraying, and the surface roughness would become small since the melting particles are flattened.

The major difference between these spraying methods is in the heat source temperature and the flying speed of melting particles. With plasma spraying, the temperature is approximately 10,000° C. and the flying speed of melting particles is roughly 700 m/sec, and, whereas, with arc spraying, the temperature is approximately 5,000° C. and the flying speed of melting particles is roughly 100 m/sec.

By utilizing the functions of plasma spraying and arc spraying, a spray coating having a large surface roughness is foremost formed on the material surface covered with arc spraying, and plasma spraying is thereafter employed to reduce the surface roughness so as to obtain the optimum surface roughness.

It is thereby possible to easily control the surface roughness to be even and stable.

Moreover, when performing arc spraying after plasma spraying, the surface roughness became too large and exceeded the optimum value, and thus not preferable.

The sprayed coating of the present invention may be formed on the sputtering target, backing plate or another surface in the sputtering apparatus where an unwanted film might be formed. In order to achieve an appropriate anchor effect with this sprayed coating, preferably, a sprayed coating having a center line average roughness Ra of 10 to 20 μm is provided.

This may be easily achieved by performing the foregoing plasma spraying after the arc spraying. And a superior effect is yielded in that the production of particles is effectively suppressed.

For application in targets, for example, the spraying of the present invention may be employed in a rectangular or circular target, as well as targets of other shapes. Here, it is also effective to form a sprayed coating on the non-erosion portion; that is, the side face of the target.

Although the side faces are often inclined faces, the present invention may also be employed in sputtering targets having a structure of perpendicular faces or planar faces successive thereto. The present invention includes all of the above.

Particularly, the production of particles from the target side face is often overlooked, but it has been observed that the sputtered particles (deposits) once adhered to the inclined side face are separated therefrom once again, float, and cause the production of particles.

Furthermore, it has become known that, rather than from the vicinity of the flat peripheral erosion face, the separation of such deposits occurs more often from a location distant therefrom. Therefore, the formation of a sprayed coating on such side face is extremely easy, and there is an advantage in that the production of particles can be effectively suppressed.

As the material of the sprayed coating, a material of the same quality of material as the target material may be used, or other materials may be used, so as long as arc spraying and plasma spraying may be performed thereto. Here, the only limitation would be that it is desirable to use a material that will not contaminate the sputtering thin film to the substrate.

As described above, since the sprayed coating shows a unique anchor effect, this is not particularly limited unless it becomes a cause of contamination due to the sprayed coating separates as a result of the sprayed coating becoming vulnerable.

As such examples, used may be Ti, Zr, Hf, Nb, Ta, Mo, W, Al, Cu, and alloys or the like with these as the main component.

Moreover, as the backing plate material, the ordinarily used copper, copper alloy, aluminum, aluminum alloy and the like may be used, and there is no limitation. With respect to the sputtering apparatus, it is not particularly necessary to specify a material, and sprayed coating may be formed on stainless steel or other material surfaces.

When the side face of the sputtering target is of an inclined face, in particular, the present invention may be used for sputtering targets in which the side face thereof to be connected to the backing plate is broadening toward such backing plate.

Particularly, with the sprayed coating of the present invention, it is desirable that the sprayed coating is formed successively along the sputtering target side face and the backing plate face.

As described above, there is a trend toward the particles being produced due to the differences in the materials between the target side face and the backing plate and the difference in thermal expansion as a result thereof, and the evident difference between the materials. Nevertheless, by forming a sprayed coating having a strong anchor effect at this problematic portion, the production of particles may be effectively prevented.

The formation of the successive sprayed coatings to the backing plate may be over the entire face in which the target is exposed, or may be in the vicinity of the connection with the target. The present invention includes all of the above. Therefore, it goes without saying that the sprayed coating may be formed successively along the sputtering target side face, lower planar face and backing plate face.

EXAMPLES

Next, the Examples and Comparative Examples of the present invention are explained. The Examples are mere exemplifications of the present invention, and shall not limit the present invention in any way. In other words, modifications and other modes based on the technical spirit of the present invention shall all be included herein.

Example 1

A sprayed coating was formed on a stainless plate (SUS304) under the following conditions.
(Arc Spraying Conditions)
Current: 20 A
Voltage: 260V
Air Pressure: 80 psi
Wire Used: φ1.6 mm aluminum wire (purity 99.6)
Wire Feed: 6 g/min
Distance between Spraying Gun and Stainless Plate: 200 mm
(Plasma Spraying Conditions)
Current: 750 A
Voltage: 30V
Ar Gas Pressure: 55 psi
He Gas Pressure: 50 psi
Raw Material Feed: 6 g/min
Distance between Spraying Gun and Stainless Plate: 200 mm
Raw Material Powder Used: Aluminum powder+5% magnesium alloy powder (average grain diameter 75 μm)
Spray Time: Arc spraying 3 sec+plasma spraying 2 sec Comparative Example 1

Arc spraying was performed to a stainless plate under the following conditions.
(Arc Spraying Conditions)
Current: 20 A
Voltage: 260V
Air Pressure: 80 psi
Wire Used: φ1.6 mm aluminum wire (purity 99.6)
Wire Feed: 6 g/min
Distance between Spraying Gun and Stainless Plate: 200 mm
Spray Time: 5 sec Comparative Example 2

(Plasma Spraying Conditions)
Current: 750 A
Voltage: 30V
Ar Gas Pressure: 55 psi
He Gas Pressure: 50 psi
Raw Material Feed: 6 g/min
Distance between Spraying Gun and Stainless Plate: 200 mm
Raw Material Powder Used: Aluminum powder+5% magnesium alloy powder (average grain diameter 75 μm)

Spray Time: 5 sec

The sprayed surface area of foregoing Example 1 and Comparative Examples 1 and 2 was within the range of approximately 150 mm in diameter. The measurement results of the surface roughness of Example 1 and Comparative Examples 1 and 2 are shown in Table 1. The surface roughness was measured in 10 locations.

As shown in Table 1, in comparison to Comparative Examples 1 and 2, with the arc spraying+plasma spraying of Example 1, if is easy to control the roughness to be the target surface roughness of 10 to 20 ìm Ra, and there is minimal variation in the surface roughness.

TABLE 1

Measurement Results of Surface Roughness (Center Line Surface Roughness Ra ($\mu$m))

|   | Example | Comparative Example 1 | Comparative Example 2 |
|---|---|---|---|
| 1 | 16.22 | 21.30 | 11.80 |
| 2 | 16.87 | 17.50 | 10.25 |
| 3 | 15.14 | 19.50 | 11.76 |
| 4 | 17.89 | 23.50 | 9.80 |
| 5 | 15.50 | 20.17 | 10.77 |
| 6 | 14.51 | 18.80 | 9.90 |
| 7 | 16.40 | 19.70 | 10.50 |
| 8 | 17.30 | 21.20 | 11.30 |
| 9 | 17.30 | 22.30 | 9.80 |
| 10 | 15.10 | 19.80 | 9.20 |
| Average | 16.22 | 20.38 | 10.41 |
| Standard Deviation | 1.070 | 1.654 | 0.960 |

Example 2

A sprayed coating was formed under the arc spraying+ plasma spraying conditions shown in Example 1 to the side face portion of a discoid high purity titanium having a diameter of 300 mm and thickness of 10 mm.

However, the distance between the spraying gun and work (target) was set to approximately 300 mm, and the sprayed coating thickness was controlled by altering the rotation of the work (target) to 50, 60, 70 rpm.

This side face sprayed target was mounted on a sputtering apparatus, and a TiN film was formed with reactive sputtering. Sputtering was performed until the TiN film thickness became 40 ìm, and the situation of the adhered film was observed.

Comparative Example 3

Similar to Example 2, a sprayed coating was formed under the arc spraying (only) condition shown in Comparative Example 1 to the side face portion of a discoid high purity titanium. The distance between the spraying gun and work (target) was set to approximately 300 mm, and the sprayed coating thickness was controlled by altering the rotation of the work (target) to 50, 60, 70 rpm.

This side face sprayed target was mounted on a sputtering apparatus, and a TiN film was formed with reactive sputtering. Sputtering was performed until the TiN film thickness became 40 $\mu$m, and the situation of the adhered film was observed.

Comparative Example 4

Similar to Example 2, a sprayed coating was formed under plasma spraying (only) condition shown in Comparative Example 2 to the side face portion of a discoid high purity titanium. The distance between the spraying gun and work (target) was set to approximately 300 mm, and the sprayed coating thickness was controlled by altering the rotation of the work (target) to 50, 60, 70 rpm.

This side face sprayed target was mounted on a sputtering apparatus, and a TiN film was formed with reactive sputtering. Sputtering was performed until the TIN film thickness became 40 ìm, and the situation of the adhered film was observed.

The results of Example 2 and Comparative Examples 3 and 4 are shown in Table 2. When forming a coating with the arc spraying+plasma spraying method of Example 2, separation of the adhered TiN film could not be observed in those with the work rotation set to 50, 60 rpm, but the 70 rpm one with a thin sprayed coating showed separation. It is considered that the film thickness of the sprayed coating needs to be roughly 200 $\mu$m or more.

The one to which arc spraying was performed in Comparative Example 3 had a large surface roughness, the surface condition was uneven, and separation of the TiN film from such uneven portion was observed.

Moreover, the one to which plasma spraying was performed in Comparative Example 4 had a small surface roughness, had an insufficient anchor effect in securely adhering the TiN film, and the separation of the TiN film was observed.

TABLE 2

|   | Work Rotation (rpm) | Sprayed Film Thickness ($\mu$m) | Surface Roughness Ra of Sprayed Film ($\mu$m) | TiN Film Thickness ($\mu$m) | Existence of Separation of Sputtered Particles |
|---|---|---|---|---|---|
| Example 2 Arc + Plasma Spraying | 50 | 265 | 15.2 | 40 | No Separation |
|  | 60 | 210 | 13.8 | 41 | No Separation |
|  | 70 | 170 | 12.6 | 39 | Separation of TiN Film |
| Comparative Example 3 Arc Spraying | 50 | 260 | 27.8 | 42 | Separation of TiN Film |
|  | 60 | 200 | 24.6 | 41 | Separation of TiN Film |
|  | 70 | 175 | 22.6 | 39 | Separation of TiN Film |
| Comparative Example 4 Plasma Spraying | 50 | 280 | 10.2 | 38 | Separation of TiN Film |
|  | 60 | 220 | 8.4 | 42 | Separation of TiN Film |
|  | 70 | 160 | 6.7 | 39 | Separation of TiN Film |

The surface roughness was measured in a direction of 90° in the peripheral direction with a 5-point average.

A superior effect is yielded in that obtained is a sputtering target, backing plate or sputtering apparatus and a sputtering method capable seeking the improvement in the sprayed coating and forming an arc-spraying coating film and a plasma-spraying coating film over the form, and thereby directly preventing the separation and flying of a deposit from the target, backing plate or another surface where an unwanted film might be formed in the sputtering apparatus in a more effective manner.

What is claimed is:

1. A sputtering target or backing plate producing few particles, comprising one of a sputtering target and backing plate and a sprayed coating thereon, said sprayed coating including an arc-spraying coating film and a plasma-spraying coating film over the former formed on one of the sputtering target and backing plate where an unwanted film might be formed.

2. A sputtering target or backing plate according to claim 1, wherein said sprayed coating has a surface roughness of 10 to 20 µm Ra.

3. A sputtering target or backing plate according to claim 1, wherein said sprayed coating extends on a side face of the sputtering target and continuously onto a face of said backing plate.

4. A sputtering target or backing plate according to claim 2, wherein said sprayed coating extends on a side face of the sputtering target and continuously onto a face of said backing plate.

5. A sputtering target or backing plate according to claim 1, wherein said sputtering target has a sputtering face opposite said backing plate and a side face extending between the sputtering face and backing plate, and wherein said sprayed coating is located on said side face of the sputtering target beginning at a spaced distance from said sputtering face and extending in a direction toward said backing plate.

6. A sputtering target or backing plate according to claim 2, wherein said sputtering target has a sputtering face opposite said backing plate and a side face extending between the sputtering face and backing plate, and wherein said sprayed coating is located on said side face of the sputtering target beginning at a spaced distance from said sputtering face and extending in a direction toward said backing plate.

7. A sputtering method producing few particles, comprising the steps of forming a sprayed coating including an arc-spraying coating film and a plasma-spraying coating film over the former on one of a sputtering target and backing plate where an unwanted film might be formed.

8. A sputtering method according to claim 7, wherein during said forming step, said sprayed coating is formed such that it has a surface roughness of 10 to 20 µm Ra.

9. A sputtering method according to claim 7, wherein during said forming step, said arc-spraying coating film and said plasma-spraying coating film are sequentially applied to at least one of a side face of the sputtering target and a face of said backing plate.

10. A sputtering method according to claim 7, wherein said sputtering target has a sputtering face opposite said backing plate and a side face extending between the sputtering face and backing plate, and wherein, during said forming step, said sprayed coating is applied on said side face of the sputtering target beginning at a spaced distance from said sputtering face and in a direction toward said backing plate.

11. A sputtering method according to claim 7, wherein said sprayed coating is made of a material including at least one of an aluminum and aluminum alloy.

12. A sputtering method according to claim 7, wherein said sprayed coating includes an arc-spraying coating film of aluminum and a plasma-spraying coating film of an aluminum alloy containing magnesium.

13. A sputtering method according to claim 8, wherein during said forming step, said arc-spraying coating film and said plasma-spraying coating film are sequentially applied to at least one of a side face of the sputtering target and a face of said backing plate.

14. A sputtering method according to claim 8, wherein said sputtering target has a sputtering face opposite said backing plate and a side face extending between the sputtering face and backing plate, and wherein, during said forming step, said sprayed coating is applied on said side face of the sputtering target beginning at a spaced distance from said sputtering face and in a direction toward said backing plate.

15. A sputtering method according to claim 8, wherein said sprayed coating is made of a material including at least one of an aluminum and aluminum alloy.

16. A sputtering method according to claim 8, wherein said sprayed coating includes an arc-spraying coating film of aluminum and a plasma-spraying coating film of an aluminum alloy containing magnesium.

17. A sputtering target or backing plate producing few particles, comprising one of a sputtering target and backing plate and a sprayed coating thereon, said sprayed coating including an arc-spraying coating film of aluminum and a plasma-spraying coating film of an aluminum alloy containing magnesium over the former formed on one of the sputtering target and backing plate where an unwanted film might be formed.

18. A sputtering target or backing plate according to claim 17, wherein said sprayed coating extends on a side face of the sputtering target and continuously onto a face of said backing plate.

19. A sputtering target or backing plate according to claim 17, wherein said sputtering target has a sputtering face opposite said backing plate and a side face extending between the sputtering face and backing plate, and wherein said sprayed coating is located on said side face of the sputtering target beginning at a spaced distance from said sputtering face and extending in a direction toward said backing plate.

* * * * *